United States Patent
Kousai et al.

(10) Patent No.: US 8,340,620 B2
(45) Date of Patent: *Dec. 25, 2012

(54) FREQUENCY CONVERTING CIRCUIT AND RECEIVER

(75) Inventors: Shouhei Kousai, Pasadena, CA (US);
Daisuke Miyashita, Kawasaki (JP); Jun Deguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/369,536

(22) Filed: Feb. 9, 2012

(65) Prior Publication Data

US 2012/0135700 A1      May 31, 2012

Related U.S. Application Data

(62) Division of application No. 12/240,093, filed on Sep. 29, 2008, now Pat. No. 8,135,374.

(30) Foreign Application Priority Data

Oct. 2, 2007   (JP) .................................. 2007-258553

(51) Int. Cl.
   *H04B 1/26*   (2006.01)
(52) U.S. Cl. .................. 455/323; 375/130; 375/316
(58) Field of Classification Search .................. 455/323
   See application file for complete search history.

(56) References Cited

U.S. PATENT DOCUMENTS

| | | | |
|---|---|---|---|
| 6,472,925 B1 * | 10/2002 | Komurasaki et al. | 327/361 |
| 7,095,284 B2 * | 8/2006 | van Zeijl | 330/296 |
| 2004/0218693 A1 * | 11/2004 | Hickling | 375/316 |
| 2005/0213635 A1 * | 9/2005 | Terada et al. | 375/130 |
| 2007/0213026 A1 * | 9/2007 | Miyashita | 455/323 |

FOREIGN PATENT DOCUMENTS

| | | |
|---|---|---|
| CN | 1729626 A | 2/2006 |
| EP | 0 276 130 A2 | 7/1988 |
| JP | 3288723 | 3/2002 |
| JP | 2007-43691 | 2/2007 |
| WO | WO 2006/002945 A1 | 1/2006 |
| WO | WO 2007/082282 A1 | 7/2007 |

OTHER PUBLICATIONS

Office Action issued Sep. 10, 2010, in China Patent Application No. 200810165988.1.
Office Action issued Feb. 15, 2011 in Japan Application No. 2007-258553 (With English Translation).
Office Action issued Jul. 15, 2011 in Japan Application No. 2007-258553 (With English Translation).

* cited by examiner

*Primary Examiner* — Duc Nguyen
*Assistant Examiner* — Ajibola Akinyemi
(74) *Attorney, Agent, or Firm* — Oblon, Spivak, McClelland, Maier & Neustadt, L.L.P.

(57) ABSTRACT

A frequency converting circuit that outputs an output signal obtained by mixing a first input signal and a second input signal, has: a first input terminal to which the first input signal is input; a second input terminal to which the second input signal is input; an output terminal from which the output signal is output; a frequency converting element that has a first input part connected to the first input terminal and an output part connected to the output terminal, restricts the signal input to the first input part according to a signal input to a second input part and outputs the restricted signal to the output part; and a pulse controlling circuit that receives the second input signal via the second input terminal and outputs a pulse signal obtained by restricting the pulses of the second input signal to the second input part of the frequency converting element.

16 Claims, 7 Drawing Sheets

FREQUENCY CONVERTING CIRCUIT AND RECEIVER

CROSS-REFERENCE TO RELATED APPLICATION

This application is a divisional of and claims the benefit of priority under 35 U.S.C. §120 from U.S. Ser. No. 12/240,093, filed Sep. 29, 2008, and claims the benefit of priority under 35 U.S.C. §119 from the prior Japanese Patent Application No. 2007-258553, filed on Oct. 2, 2007, the entire contents of which are incorporated herein by reference.

BACKGROUND OF THE INVENTION

1. Field of the Invention

The present invention relates to a frequency converting circuit and a receiver used in a radio LSI, for example.

2. Background Art

A frequency converting circuit (mixer) provides the output signal with a frequency determined by the frequencies of two or more input signals.

For example, a Gilbert cell mixer is a conventional frequency converting circuit (see Japanese Patent No. 3288723, for example). The Gilbert cell mixer converts the frequency "Fin" of a received signal according to the frequency "FLO" of a local oscillation (LO) signal and outputs an output signal "Fout". The conversion gain Vout/Vin from the input to the output is expressed as gm*R. The character "gm" represents the transconductance of an MOS transistor that receives the received signal at the gate thereof. The character "R" represents the resistance of a resistor connected between a power supply and an MOS transistor that receives the local oscillation signal at the gate thereof.

To change the conversion gain of the Gilbert cell mixer described above, the resistance "R" or the transconductance "gm" has to be changed. To change the transconductance "gm", the current or the width of the MOS transistor has to be changed.

However, if the current is changed, there arises a problem that the operating point of the MOS transistor changes. On the other hand, if the width of the MOS transistor is changed, there arises a problem that the input capacitance viewed from the preceding stage changes.

Thus, the conversion gain of the conventional frequency converting circuit cannot be precisely controlled.

To solve the problem, a conventional Gilbert cell mixer additionally has a gain controlling stage for changing the conversion gain (see Japanese Patent No. 3288723 described above).

However, according to the conventional technique, since the transistor used in the gain controlling stage is added, the Gilbert cell mixer is hard to operate at low frequencies, and the linearity is deteriorated.

In addition, as for the relationship between the voltage and the conversion gain controlled by the gain controlling stage, the conversion gain varies exponentially when the voltage varies linearly.

As described above, according to the conventional technique, the conversion gain cannot be accurately and precisely controlled.

SUMMARY OF THE INVENTION

According to one aspect of the present invention, there is provided: a frequency converting circuit that outputs an output signal obtained by mixing a first input signal and a second input signal, comprising:

a first input terminal to which said first input signal is input;
a second input terminal to which said second input signal is input;
an output terminal from which said output signal is output;
a frequency converting element that has a first input part connected to said first input terminal and an output part connected to said output terminal, restricts the signal input to said first input part according to a signal input to a second input part and outputs the restricted signal to said output part; and
a pulse controlling circuit that receives said second input signal via said second input terminal and outputs a pulse signal obtained by restricting the pulses of said second input signal to said second input part of said frequency converting element.

According to the other aspect of the present invention, there is provided: A receiver, comprising:

a low noise amplifier that receives a received signal, amplifies the received signal and outputs the amplified signal;
a local oscillator that outputs a local oscillation signal; and
a frequency converting circuit that has a first input terminal to which a first input signal, which depends on said amplified signal output from said low noise amplifier, is input, a second input terminal to which a second input signal, which is the local oscillation signal, is input, an output terminal from which an output signal obtained by mixing said first input signal and said second input signal is output, a mixing transistor having an end connected to said first input terminal and another end connected to said output terminal, and a pulse controlling circuit that receives said second input signal via said second input terminal and outputs a pulse signal obtained by restricting the pulses of said second input signal to a control electrode of said mixing transistor.

DETAILED DESCRIPTION

In the following, embodiments of the present invention will be described with reference to the drawings.

Embodiment 1

Figure 1:
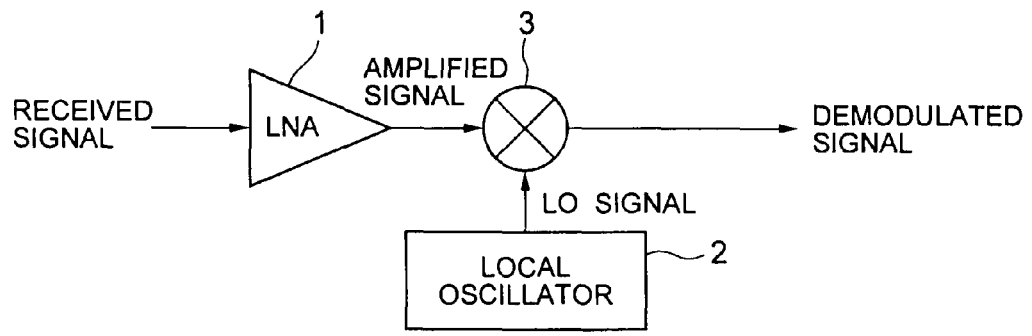
FIG. 1 is a diagram showing a configuration of essential parts of a receiver 100 according to an embodiment 1 of the present invention, which is an aspect of the present invention.

FIG. 1 is a diagram showing a configuration of essential parts of a receiver 100 according to an embodiment 1 of the present invention, which is an aspect of the present invention.

As shown in FIG. 1, the receiver 100 has a low noise amplifier (LNA) 1, a local oscillator 2, and a frequency converting circuit (mixer) 3.

The low noise amplifier 1 receives a received signal (a radio frequency (RF) signal, for example), amplifies the received signal and outputs the amplified signal.

The local oscillator 2 outputs a local oscillation signal.

The frequency converting circuit 3 outputs a signal produced by mixing a first input signal (RF current signal), which depends on the amplified signal output from the low noise amplifier 1, and a second input signal, which is the local oscillation signal. Based on this output signal, a demodulated signal is produced.

Figure 2:
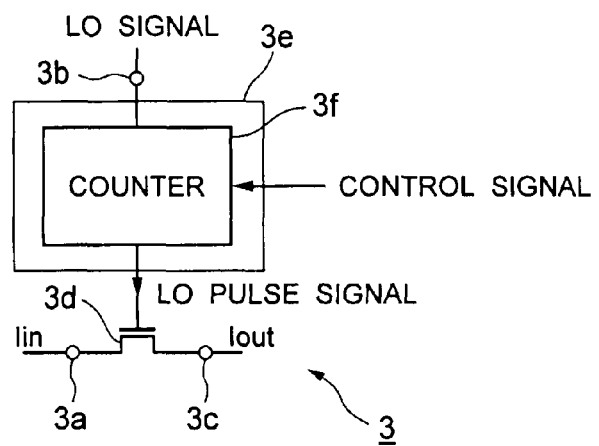
FIG. 2 is a diagram showing an exemplary configuration of essential parts of the frequency converting circuit 3 used in the receiver 100 shown in FIG. 1.

FIG. 2 is a diagram showing an exemplary configuration of essential parts of the frequency converting circuit 3 used in the receiver 100 shown in FIG. 1.

As shown in FIG. 2, the frequency converting circuit 3 has a first input terminal 3a to which a first input signal (RF current signal) "Iin" is input, a second input terminal 3b to which a second input signal (LO signal) is input, and an output terminal 3c from which an output signal "Iout" is output.

The frequency converting circuit 3 further has a mixing transistor 3d, which is a frequency converting element, and a pulse controlling circuit 3e.

For example, the mixing transistor 3d is an n-type MOS transistor that is connected to the first input terminal 3a at an end (drain), which is a first input part, and connected to the output terminal 3c at another end (source), which is an output part.

The mixing transistor 3d constituting the frequency converting element may be a p-type MOS transistor or a bipolar transistor, for example. Furthermore, the frequency converting element is not limited to the transistors but can be any element that combines two signals and outputs the resulting combination signal. Therefore, the frequency converting element may have a common input part that doubles as the first input part and the second input part.

The pulse controlling circuit 3e is connected between the second input terminal 3b and the mixing transistor 3d. The pulse controlling circuit 3e is configured to receive the second input signal (LO signal) via the second input terminal 3b. The pulse controlling circuit 3e is configured to output an LO pulse signal, which is produced by restricting the pulses of the LO signal, to a control electrode (gate) of the mixing transistor 3d.

Furthermore, as shown in FIG. 2, the pulse controlling circuit 3e has a counter 3f, for example. For example, the counter 3f counts the pulses of the LO signal according to a control signal associated with a variable "N" (N≧1) and produces an LO pulse signal by restricting the period in which the LO signal has "High" pulses to 1/N. The LO pulse signal is input to the control electrode (gate) of the mixing transistor 3d as described above.

The variable "N" is set by an external device that adjusts a conversion gain (not shown) or a user, for example.

While the control signal is externally input in this embodiment, the control signal may be produced based on the variable "N" in the pulse controlling circuit 3e.

The counter 3f in this embodiment is a digital circuit, and therefore, CMOS implementation is suitable for the counter 3f.

Figure 3:
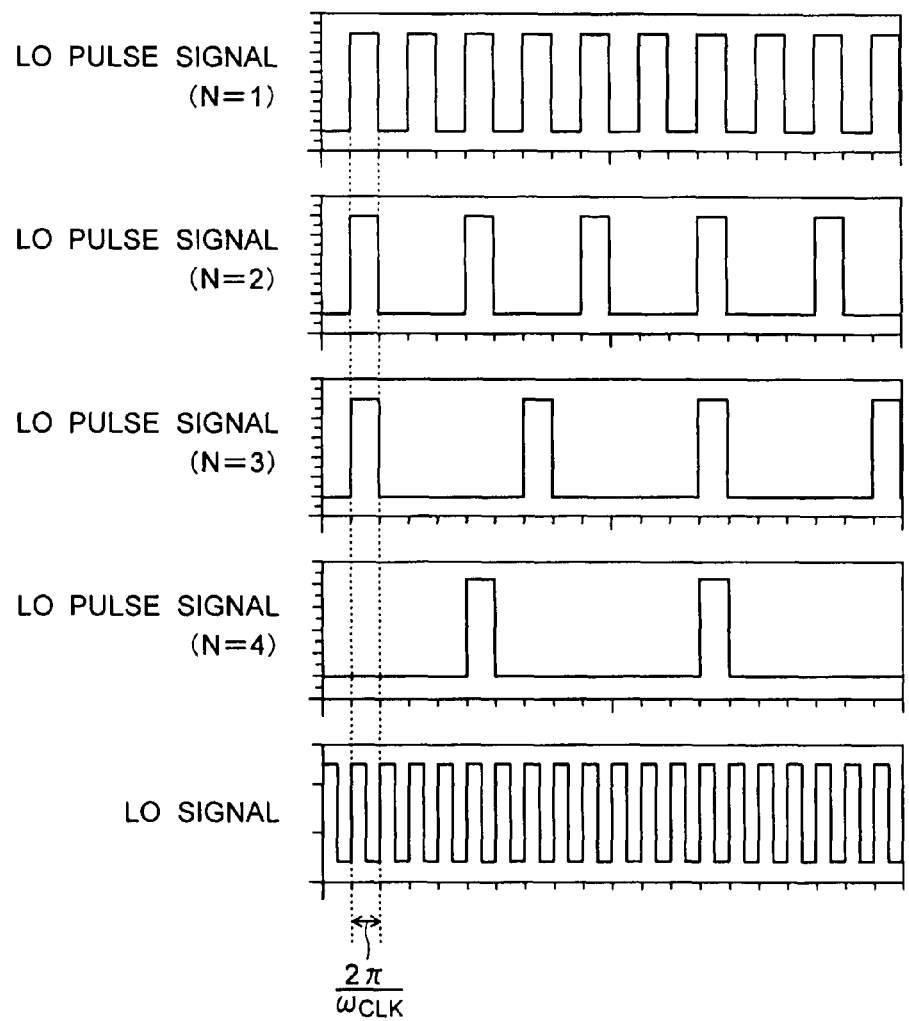
FIG. 3 is a diagram showing a relationship between a waveform of the LO signal produced by the local oscillator 2 and waveforms of the LO pulse signal produced by the counter 3f shown in FIG. 2.

FIG. 3 is a diagram showing a relationship between a waveform of the LO signal produced by the local oscillator 2 and waveforms of the LO pulse signal produced by the counter 3f shown in FIG. 2. FIG. 3 shows waveforms of the LO pulse signal in the cases of the variable N=1, 2, 3 and 4, for example.

As shown in FIG. 3, the counter 3f outputs the LO pulse signal at the "High" level for one period of the LO signal ($2\pi/\omega_{CLK}$) from the point in time when the count of the pulses of the LO signal reaches 2N. The counter 3f is reset when the count reaches 2N. After that, the counter 3f repeats the same operation.

In this way, the counter 3f outputs the LO pulse signal produced by restricting the period in which the LO signal has "High" pulses to 1/N (that is, restricting the number of pulses of the LO signal to 1/2N). When the logic of the circuit is reversed, the counter 3f outputs the LO pulse signal produced by restricting the period in which the LO signal has "Low" pulses to 1/N (that is, restricting the number of pulses of the LO signal to 1/2N).

Thus, the mixing transistor 3d, which is an n-type MOS transistor, is maintained in the on state for the period in which the LO pulse signal is at the "High" level or, in other words, turned on in response to the pulses of the LO pulse signal. As a result, the output signal "Iout", which is down-converted from the input signal "Iin", is produced.

As described above, the mixing transistor 3d, which is a frequency converting element, restricts (down-converts) the signal (input signal) input to the first input part according to the signal (LO pulse signal) input to the second input part (gate) and outputs the resulting signal to the output part.

Next, there will be described a principle of changing the conversion gain of the frequency converting circuit 3 configured as described above.

The input signal (RF current signal) "Iin" is expressed by the formula (1). It is supposed that $\omega_{CLK}$ denotes the frequency of the LO signal.

$$Iin = A \sin \omega_{RF} t \qquad (1)$$

When the variable N=1, the LO pulse signal is a square wave at a frequency of $\omega_{CLK}/2$. Therefore, at the output terminal 3c, in addition to the frequency components $\omega_{RF}$ and $\omega_{CLK}/2$, frequency components $\omega_{RF}+\omega_{CLK}/2$ and $\omega_{RF}-\omega_{CLK}/2$, which are results of multiplication of the LO pulse signal and the RF signal due to switching, are observed.

Here, description will be focused on an output signal (BB signal) "Iout" converted to a low frequency. The BB signal has a frequency of $\omega_{RF}-\omega_{CLK}/2$.

The output signal "Iout", which is a signal component at the frequency, is expressed by the formula (2). In this formula, the character θ denotes a certain phase that assumes a value ranging from 0 to 2π.

$$Iout = B \sin\{(\omega_{RF} - \omega_{CLK}/2)t + \theta\} \quad (2)$$

Based on the formulas (1) and (2), the conversion gain "G" of the frequency converting circuit is expressed by the formula (3).

$$G = B/A \quad (3)$$

As described above, the output signal is obtained as the product (as a result of multiplication) of the RF signal and the LO pulse signal. Therefore, the conversion gain is proportional to the number of pulses of the LO pulse signal (that is, the period in which the LO pulse signal is at the "High" level). For example, by reducing the number of pulses by increasing the variable "N" (N=1, 2, 3 and so on, for example), the conversion gain can be changed without changing the frequency of the down-converted BB output signal.

That is, since the number of pulses of the LO pulse signal is proportional to 1/N, the conversion gain of the frequency converting circuit 3 is also proportional to 1/N.

Figure 4:
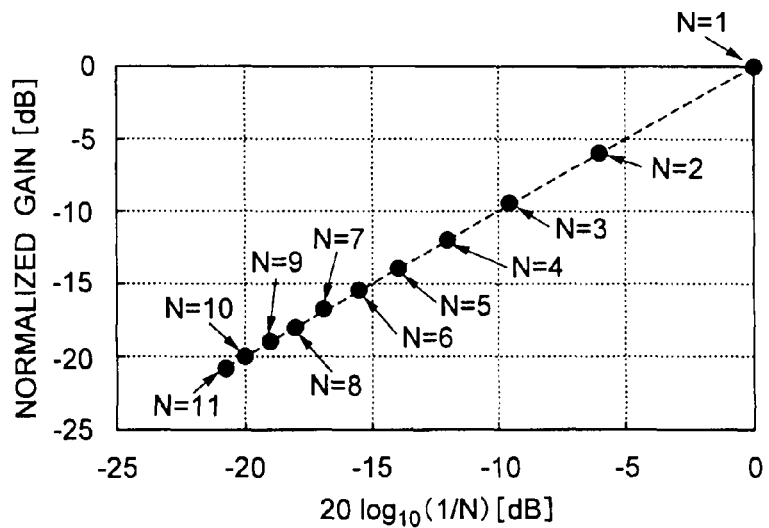
FIG. 4 is a graph showing a relationship between the conversion gain of the frequency converting circuit 3 according to this embodiment and 1/N.

FIG. 4 is a graph showing a relationship between the conversion gain of the frequency converting circuit 3 according to this embodiment and 1/N. In FIG. 4, the conversion gain of the frequency converting circuit is normalized on the assumption that the conversion gain is 1 (0 dB) when the variable N=1.

As shown in FIG. 4, the gain of the frequency converting circuit 3 according to this embodiment changes linearly with 1/N. Thus, the conversion gain can be more accurately controlled.

As described earlier, frequency components $\omega_{RF}$ and $\omega_{CLK}/2$ appear at the output terminal 3c of the frequency converting circuit 3. However, the frequency components $\omega_{RF}$ and $\omega_{CLK}/2$ can be partially or completely suppressed by using a single balanced mixer or a double balanced mixer.

As described above, the conversion gain of the frequency converting circuit according to this embodiment can be more accurately controlled.

The frequency converting circuit having the configuration and function described above can be applied not only to gain control of receivers but also to gain control of radio communication systems.

Embodiment 2

In the embodiment 1, a case where the variable "N" is a positive integer has been described. Therefore, the conversion gain can be adjusted only in large steps of −6 dB, −9.5 dB, −12 dB, for example.

Thus, in an embodiment 2, there will be described a configuration for adjusting the conversion gain in smaller steps by using a delta sigma modulator to control the variable "N".

Figure 5:
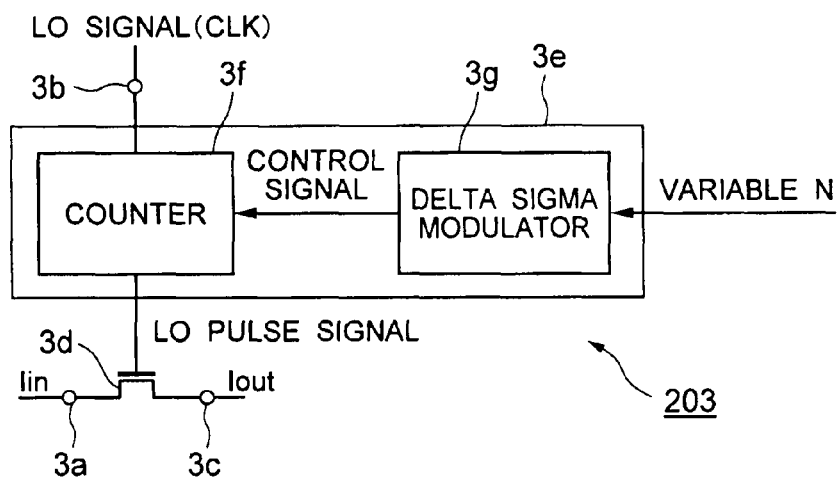
FIG. 5 is a diagram showing a configuration of essential parts of a frequency converting circuit 203 according to the embodiment 2 of the present invention, which is an aspect of the present invention.

FIG. 5 is a diagram showing a configuration of essential parts of a frequency converting circuit 203 according to the embodiment 2 of the present invention, which is an aspect of the present invention.

As with the frequency converting circuit 3 according to the embodiment 1, the frequency converting circuit 203 according to the embodiment 2 is applied to the receiver 100 shown in FIG. 1.

As shown in FIG. 5, compared with the pulse controlling circuit according to the embodiment 1, a pulse controlling circuit 3e of the frequency converting circuit 203 further has a delta sigma modulator 3g that outputs a control signal that depends on the variable "N" to a counter 3f. In this embodiment, the variable "N" can assume any real number equal to or larger than 1 including the positive integers.

The delta sigma modulator 3g outputs a control signal that makes the counter 3f output an LO pulse signal by restricting the period in which an LO signal has "High" pulses to 1/N (that is, restricting the number of pulses of the LO signal to 1/2N) in a certain interval.

That is, the delta sigma modulator 3g outputs a control signal that reduces the probability that a mixing transistor 3d, which is a frequency converting element, is turned on to 1/N.

The counter 3f and the delta sigma modulator 3g according to this embodiment are digital circuits, and therefore, CMOS implementation is suitable for the counter 3f and the delta sigma modulator 3g.

Figure 6:
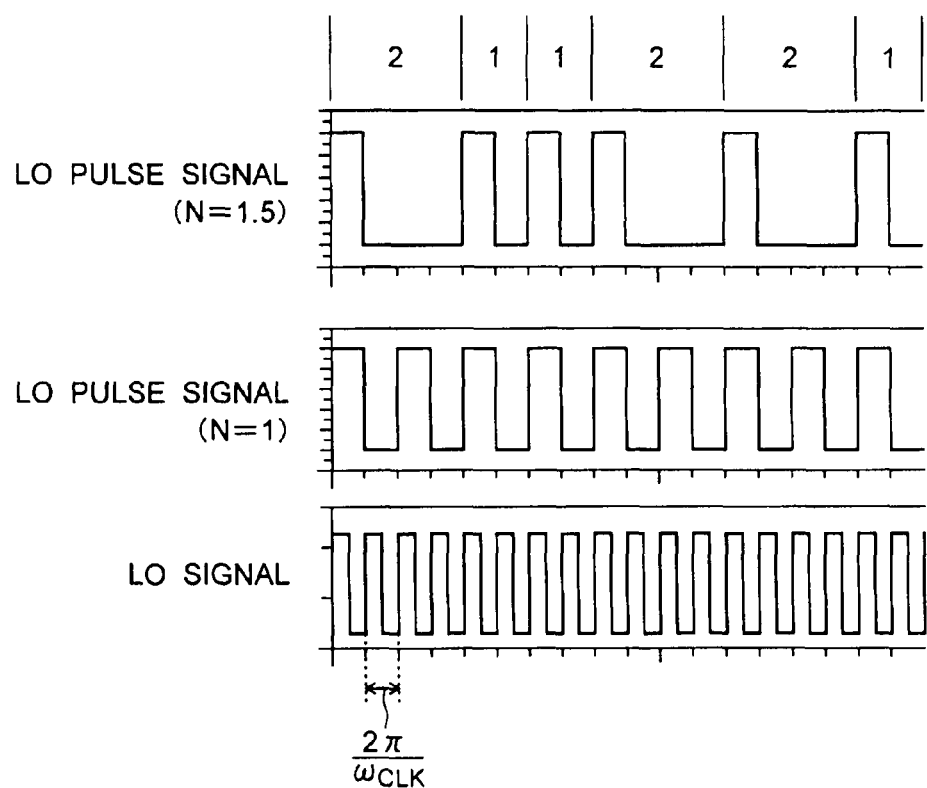
FIG. 6 is a diagram showing waveforms of the LO pulse signal in cases of the variable N=1 and 1.5 and a waveform of the LO signal.

FIG. 6 is a diagram showing waveforms of the LO pulse signal in cases of the variable N=1 and 1.5 and a waveform of the LO signal.

As shown in FIG. 6, under the influence of the delta sigma modulation, the count of the counter 3f changes with time (1 or 2). Therefore, the average of the count of the counter 3f for a certain interval is 1.5. That is, the counter 3f outputs the LO pulse signal by restricting the period in which the LO signal has "High" pulses to 1/1.5 (that is, restricting the number of pulses of the LO signal to one third).

For example, a comparison will be made with the LO pulse signal in the case of the variable N=1. In FIG. 6, when the variable N=1, the total number of pulses of the LO signal is 9. On the other hand, when the variable N=1.5, the total number of pulses of the LO signal is 6.

Therefore, when the variable "N" is set at 1.5, the conversion gain of the frequency converting circuit 203 is reduced to 2/3, that is, −3.5 dB, compared with the case of N=1.

While the variable "N" equals to the count of the counter 3f in FIG. 6, the frequency converting circuit operates in the same way as far as the two values are in a proportional relationship.

Figure 7:
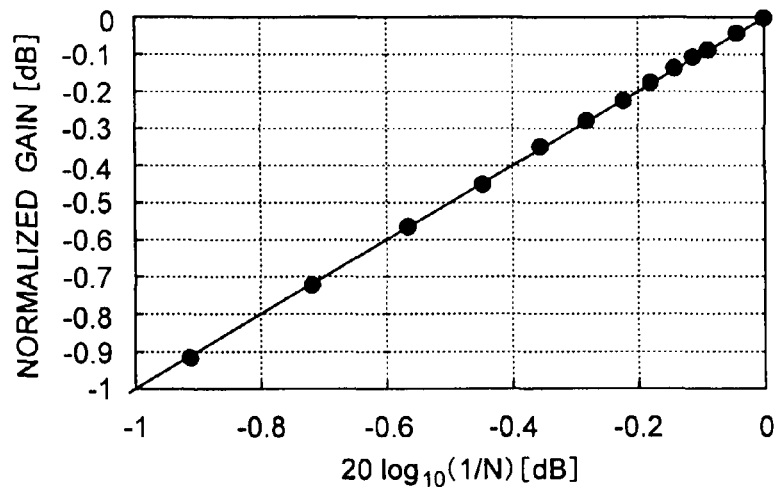
FIG. 7 is a graph showing a relationship between the conversion gain of the frequency converting circuit 203 according to this embodiment and 1/N.
Figure 8:
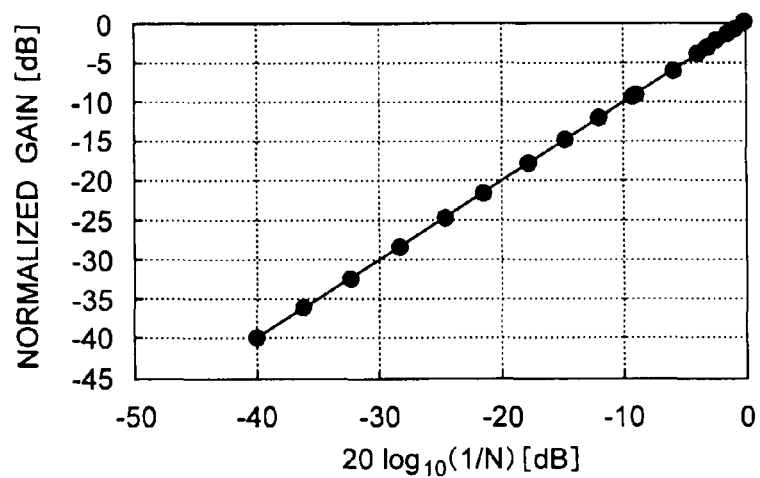
FIG. 8 is a graph showing a relationship between the conversion gain of the frequency converting circuit 203 according to this embodiment and 1/N.

FIGS. 7 and 8 are graphs showing a relationship between the conversion gain of the frequency converting circuit 203 according to this embodiment and 1/N. In FIGS. 7 and 8, the conversion gain of the frequency converting circuit is normalized on the assumption that the conversion gain is 1 (0 dB) when the variable N=1.

As shown in FIGS. 7 and 8, as a result of using the delta sigma modulator, the variable "N" is set at a real number equal to or larger than 1. As a result, the conversion gain can be "accurately" adjusted in extremely small steps over a wide range. The word "accurately" used herein means that the conversion gain is accurately proportional to 1/N.

As described above, the conversion gain of the frequency converting circuit according to this embodiment can be more accurately controlled.

As with the embodiment 1, the frequency converting circuit having the configuration and function described above can be applied not only to gain control of receivers but also to gain control of radio communication systems.

Embodiment 3

In the embodiments 1 and 2, configurations in which a counter is used to restrict the number of pulses of the LO signal have been described. That is, in the embodiments 1 and 2, the LO pulse signal is produced using the LO signal and a counter.

However, the frequency converting circuit can operate in the same way if the LO pulse signal is produced by turning on and off the LO signal using a switch element.

Thus, in an embodiment 3, there will be described a configuration in which a switch element is used to restrict the number of pulses of the LO signal.

Figure 9:
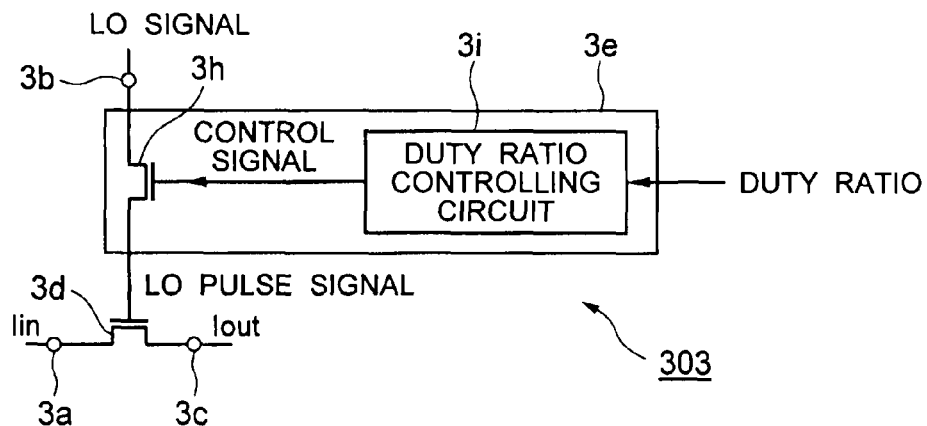
FIG. 9 is a diagram showing a configuration of essential parts of a frequency converting circuit 303 according to the embodiment 3 of the present invention, which is an aspect of the present invention.

FIG. 9 is a diagram showing a configuration of essential parts of a frequency converting circuit 303 according to the embodiment 3 of the present invention, which is an aspect of the present invention.

As with the frequency converting circuit 3 according to the embodiment 1, the frequency converting circuit 303 according to the embodiment 3 is applied to the receiver 100 shown in FIG. 1.

As shown in FIG. 9, a pulse controlling circuit 3e of the frequency converting circuit 303 has a switch element 3h and a duty ratio controlling circuit 3i.

The duty ratio controlling circuit 3i is configured to output a control signal to the switch element 3h based on the duty ratio that determines the restriction on the number of pulses of a second input signal (LO signal).

The switch element 3h is connected between a second input terminal 3b and a control electrode (gate) of a mixing transistor 3d, which is a second input part of the mixing transistor 3d. In this embodiment, an MOS transistor is used as the switch element 3h, for example. Alternatively, other components, such as a bipolar transistor, may be used as the switch element 3h.

The switch element 3h is configured to produce an LO pulse signal by restricting the number of pulses of the second input signal (LO signal) by being turned on and off according to the control signal and outputs the LO pulse signal to the control electrode (gate) of the mixing transistor 3d.

In this embodiment, the duty ratio is a ratio that determines the restriction on the number of pulses of the second input signal (LO signal) as described earlier. That is, the duty ratio is a ratio between the number of pulses of the LO signal and the number of pulses of the LO pulse signal.

The duty ratio is set by an external device that adjusts the conversion gain (not shown) or a user, for example.

The LO signal is not limited to a rectangular wave but may be a sinusoidal wave or a wave similar thereto.

Figure 10:
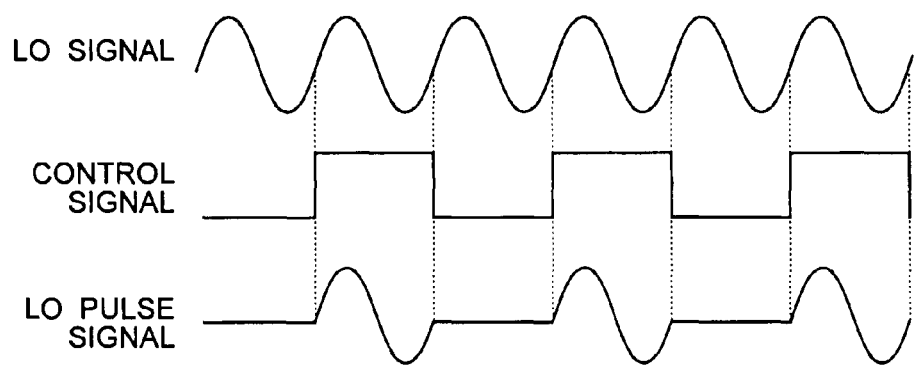
FIG. 10 is a diagram showing a waveform of the LO signal, a waveform of the control signal and a waveform of the LO pulse signal in a case where the duty ratio equals to 0.5, as an example.

FIG. 10 is a diagram showing a waveform of the LO signal, a waveform of the control signal and a waveform of the LO pulse signal in a case where the duty ratio equals to 0.5, as an example. In FIG. 10, the LO signal is a sinusoidal wave.

As shown in FIG. 10, the control signal is applied to the gate of the n-type MOS transistor, which is the switch element 3h, with a probability of 1/2, which is the duty ratio. Therefore, the number of pulses of the LO signal that passes through the switch element 3h is restricted to 1/2. As a result, compared with the case where the LO signal is directly input to the gate of the mixing transistor 3d, the conversion gain of the frequency converting circuit 303 is reduced to 1/2.

As described above, as with the conversion gain in the embodiments 1 and 2 that is proportional to 1/N, the conversion gain of the frequency converting circuit 303 is proportional to the duty ratio.

Furthermore, as with the embodiment 2, the conversion gain can be adjusted in extremely small steps over a wide range by setting the duty ratio in small steps.

As described above, the conversion gain of the frequency converting circuit according to this embodiment can be more accurately controlled.

As with the embodiment 1, the frequency converting circuit having the configuration and function described above can be applied not only to gain control of receivers but also to gain control of radio communication systems.

Embodiment 4

In the embodiment 3, a configuration in which the duty ratio controlling circuit is used to control the switch element has been described.

In an embodiment 4, there will be described a configuration in which a delta sigma modulator is used as a specific example of the duty ratio controlling circuit.

Figure 11:
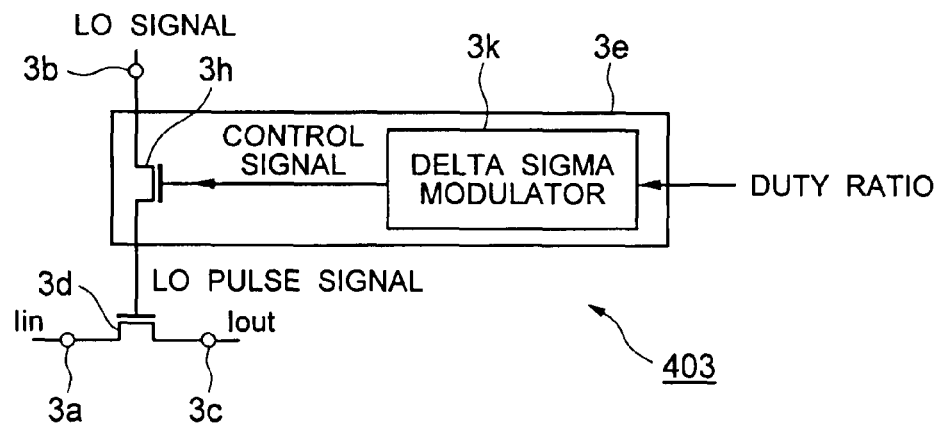
FIG. 11 is a diagram showing a configuration of essential parts of a frequency converting circuit 403 according to the embodiment 4 of the present invention, which is an aspect of the present invention.

FIG. 11 is a diagram showing a configuration of essential parts of a frequency converting circuit 403 according to the embodiment 4 of the present invention, which is an aspect of the present invention.

The parts denoted by the same reference numerals as those in the embodiment 3 are the same as those in the embodiment 3. As with the frequency converting circuit 3 according to the embodiment 1, the frequency converting circuit 403 according to the embodiment 4 is applied to the receiver 100 shown in FIG. 1.

As shown in FIG. 11, a pulse controlling circuit 3e of the frequency converting circuit 403 has a delta sigma modulator 3k as a specific example of the duty ratio controlling circuit.

As with the embodiment 3, the delta sigma modulator 3k is configured to output a control signal to a switch element 3h based on the duty ratio that determines the restriction on the number of pulses of a second input signal (LO signal).

As with the embodiment 3, the switch element 3h is configured to produce an LO pulse signal by restricting the number of pulses of the second input signal (LO signal) by being turned on and off according to the control signal and outputs the LO pulse signal to a control electrode (gate) of a mixing transistor 3d, which is a second input part of the mixing transistor 3d.

In this way, the duty ratio controlling circuit can be constituted by the delta sigma modulator.

Furthermore, as with the embodiment 3, the conversion gain of the frequency converting circuit 403 is proportional to the duty ratio. Furthermore, the conversion gain can be adjusted in extremely small steps over a wide range by setting the duty ratio in small steps.

The delta sigma modulator 3k according to this embodiment is a digital circuit, and therefore, CMOS implementation is suitable for the delta sigma modulator 3k.

As described above, the conversion gain of the frequency converting circuit according to this embodiment can be more accurately controlled.

As with the embodiment 1, the frequency converting circuit having the configuration and function described above can be applied not only to gain control of receivers but also to gain control of radio communication systems.

Embodiment 5

In the embodiments 3 and 4, a configuration in which an MOS transistor is used as the switch element to restrict the number of pulses of the LO signal has been described.

In an embodiment 5, there will be described a configuration in which an amplifier is used as the switch element to restrict the number of pulses of the LO signal.

Figure 12:
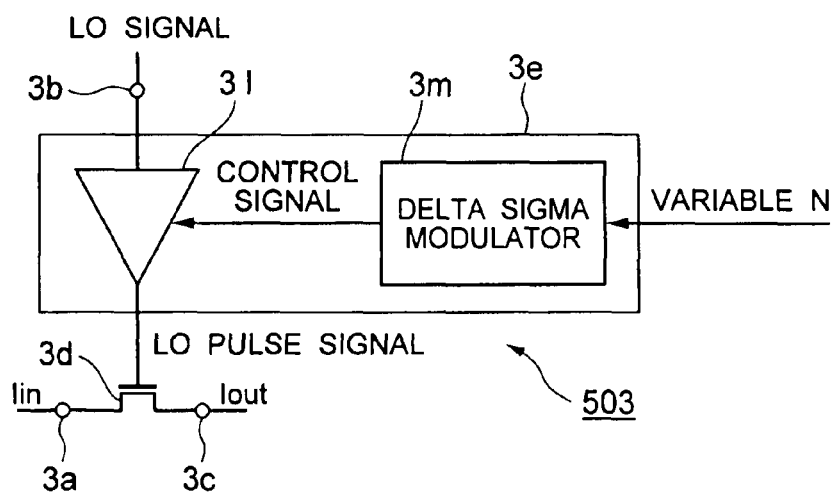
FIG. 12 is a diagram showing a configuration of essential parts of a frequency converting circuit 503 according to the embodiment 5 of the present invention, which is an aspect of the present invention.

FIG. 12 is a diagram showing a configuration of essential parts of a frequency converting circuit 503 according to the embodiment 5 of the present invention, which is an aspect of the present invention.

The parts denoted by the same reference numerals as those in the embodiment 3 are the same as those in the embodiment 3. As with the frequency converting circuit 3 according to the embodiment 1, the frequency converting circuit 503 according to the embodiment 5 is applied to the receiver 100 shown in FIG. 1.

As shown in FIG. 12, a pulse controlling circuit 3e of the frequency converting circuit 503 has an amplifier 3l that functions as a switch element and a delta sigma modulator 3m.

The delta sigma modulator 3m is configured to output a control signal to the amplifier 3l based on the variable "N" that is similar to that in the embodiment 2.

The amplifier 3l is connected between a second input terminal 3b and a control electrode (gate) of a mixing transistor 3d, which is a second input part of the mixing transistor 3d. The amplifier 3l is configured to amplify the amplitude of an LO signal and output the amplified LO signal to the gate of the mixing transistor 3d. As a result, even when the intensity of the LO signal is low, the mixing transistor 3d can operate in a linear region.

Furthermore, the amplifier 3l is configured to reduce the power according to the control signal. Therefore, in a period in which the power of the amplifier 3l is reduced, the output of the pulses of the LO signal to the gate of the mixing transistor 3d is restricted.

That is, the amplifier 3l is configured to produce an LO pulse signal by restricting the number of pulses of the second input signal (LO signal) to 1/N by reducing the power thereof according to the control signal and outputs the LO pulse signal to the control electrode (gate) of the mixing transistor 3d.

In this way, as with the embodiment 2, the conversion gain of the frequency converting circuit 503 is proportional to 1/N.

Furthermore, as with the embodiment 2, the conversion gain can be adjusted in extremely small steps over a wide range by setting the variable "N" at a real number equal to or larger than 1.

The delta sigma modulator 3m and the amplifier 3l according to this embodiment are digital circuits, and therefore, CMOS implementation is suitable for the delta sigma modulator 3m and the amplifier 3l.

As described above, the conversion gain of the frequency converting circuit according to this embodiment can be more accurately controlled.

As with the embodiment 1, the frequency converting circuit having the configuration and function described above can be applied not only to gain control of receivers but also to gain control of radio communication systems.

In the embodiments described above, the first input signal is described as an RF current signal, for example. However, the first input signal may be a base band (BB) current signal or an intermediate frequency (IF) current signal.

What is claimed is:

1. A frequency converting circuit that outputs an output signal obtained by mixing a first input signal and a second input signal, comprising:
 a first input terminal to which the first input signal is input;
 a second input terminal to which the second input signal is input;
 an output terminal from which the output signal is output;
 a frequency converting element that has a first input part connected to the first input terminal and an output part connected to the output terminal, restricts a signal input to the first input part according to a signal input to a second input part and outputs the restricted signal to the output part; and
 a pulse controlling circuit that receives the second input signal via the second input terminal and outputs a pulse signal obtained by restricting a number of pulses of the second input signal to the second input part of the frequency converting element.

2. The frequency converting circuit according to claim 1, wherein the pulse controlling circuit has:
 a switch element that is connected between the second input terminal and the second input part of the frequency converting element and is turned on and off according to a control signal to output the pulse signal obtained by restricting the number of pulses of the second input signal to the second input part of the frequency converting element.

3. The frequency converting circuit according to claim 2, wherein the switch element is a MOS transistor or a bipolar transistor.

4. The frequency converting circuit according to claim 2, wherein the pulse controlling circuit further has:
 a duty ratio controlling circuit that outputs the control signal to the switch element according to a duty ratio that determines the restriction on the number of pulses of the second input signal.

5. The frequency converting circuit according to claim 4, wherein the duty ratio controlling circuit is a delta sigma modulator.

6. The frequency converting circuit according to claim 4, wherein the switch element is a MOS transistor or a bipolar transistor and the duty ratio controlling circuit is a delta sigma modulator.

7. The frequency converting circuit according to claim 1, wherein the pulse controlling circuit has:
 a counter that counts the pulses of the second input signal according to a control signal and outputs the pulse signal having the number of pulses of which is restricted compared with the second input signal to the second input part of the frequency converting element.

8. The frequency converting circuit according to claim 7, wherein the pulse controlling circuit further has:
 a delta sigma modulator that outputs the control signal to the counter.

9. A receiver, comprising:
 a low noise amplifier that receives a received signal, amplifies the received signal and outputs an amplified signal;
 a local oscillator that outputs a local oscillation signal; and
 a frequency converting circuit that has a first input terminal to which a first input signal, which depends on the amplified signal output from the low noise amplifier, is input, a second input terminal to which a second input signal, which is the local oscillation signal, is input, an output terminal from which an output signal obtained by mixing the first input signal and the second input signal is output, a mixing transistor having an end connected to the first input terminal and another end connected to the output terminal, and a pulse controlling circuit that receives the second input signal via the second input terminal and outputs a pulse signal obtained by restricting a number of pulses of the second input signal to a control electrode of the mixing transistor.

10. The receiver according to claim 9, wherein the pulse controlling circuit has:
 a switch element that is connected between the second input terminal and the control electrode of the mixing transistor and is turned on and off according to a control signal to output the pulse signal obtained by restricting the number of pulses of the second input signal to the control electrode of the mixing transistor.

11. The receiver according to claim 10, wherein the switch element is a MOS transistor or a bipolar transistor.

12. The receiver according to claim 10, wherein the pulse controlling circuit further has:

a duty ratio controlling circuit that outputs the control signal to the switch element according to a duty ratio that determines the restriction on the number of pulses of the second input signal.

13. The receiver according to claim 12, wherein the duty ratio controlling circuit is a delta sigma modulator.

14. The receiver according to claim 12, wherein the switch element is a MOS transistor or a bipolar transistor and the duty ratio controlling circuit is a delta sigma modulator.

15. The receiver according to claim 9, wherein the pulse controlling circuit has:

a counter that counts the pulses of the second input signal according to a control signal and outputs the pulse signal having the number of pulses of which is restricted compared with the second input signal to the control electrode of the mixing transistor.

16. The receiver according to claim 15, wherein the pulse controlling circuit further has:

a delta sigma modulator that outputs the control signal to the counter.

* * * * *